(12) United States Patent
Casares

(10) Patent No.: US 9,190,834 B2
(45) Date of Patent: Nov. 17, 2015

(54) METHOD FOR THE OPERATION OF AN INVERTER, AND INVERTER

(75) Inventor: Miguel Casares, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 14/122,744

(22) PCT Filed: Apr. 4, 2012

(86) PCT No.: PCT/EP2012/056187
§ 371 (c)(1),
(2), (4) Date: Nov. 27, 2013

(87) PCT Pub. No.: WO2012/163580
PCT Pub. Date: Dec. 6, 2012

(65) Prior Publication Data
US 2014/0092654 A1    Apr. 3, 2014

(30) Foreign Application Priority Data

Jun. 1, 2011  (DE) .......................... 10 2011 076 908

(51) Int. Cl.
| H02M 1/32 | (2007.01) |
| H02H 5/04 | (2006.01) |
| H02H 7/122 | (2006.01) |
| H02H 3/05 | (2006.01) |

(Continued)

(52) U.S. Cl.
CPC ................ *H02H 7/122* (2013.01); *H02H 3/05* (2013.01); *H02H 5/04* (2013.01); *H02H 7/1203* (2013.01); *H03K 17/0826* (2013.01); *H02M 1/32* (2013.01);

(Continued)

(58) Field of Classification Search
CPC . H02H 3/085; H02H 5/04; H03K 2017/0806; G01K 7/01; G01K 7/42; H02M 1/32; H02M 2001/327

USPC ............ 374/108, 112, 137, 152; 324/750.03; 361/93.8; 307/651; 702/130; 363/141
See application file for complete search history.

(56) References Cited

U.S. PATENT DOCUMENTS 5,115,388 A * 5/1992 Shigekane ................. 363/56.03
6,724,313 B2 * 4/2004 Sato et al. ..................... 340/590

(Continued)

FOREIGN PATENT DOCUMENTS

| CN | 101570181 | 11/2009 |
| CN | 101983322 | 3/2011 |
| DE | 102007056559 | 5/2009 |
| WO | 2004107550 | 12/2004 |

OTHER PUBLICATIONS

International Search Report for Application No. PCT/EP2012/056187 dated Oct. 18, 2012 (English Translation, 3 pages).

*Primary Examiner* — Gary L Laxton
(74) *Attorney, Agent, or Firm* — Michael Best & Friedrich LLP

(57) ABSTRACT

The invention relates to a method for operating an inverter (1), in particular a pulse-controlled inverter, comprising multiple phase systems (2, 3, 4), each of which has an outer conductor (7, 8, 9) and at least one semiconductor component (12, 13), and a temperature monitoring device (15) that has multiple temperature sensors (16, 17, 18) which sense the temperature of at least one part of at least one of the phase systems (2, 3, 4). In said method, a temperature gradient is determined from each of the sensed temperatures, the difference of the determined temperature gradients from each other is ascertained, and if the difference exceeds at least one threshold value, a fault of a cooling device of the inverter (1) is identified. The invention further relates to an inverter (1).

8 Claims, 1 Drawing Sheet

(51) Int. Cl.
*H02H 7/12* (2006.01)
*H03K 17/082* (2006.01)
*G01K 7/01* (2006.01)
*H02P 29/00* (2006.01)
*H03K 17/08* (2006.01)

(52) U.S. Cl.
CPC ...... *H02M 2001/327* (2013.01); *H02P 29/0088* (2013.01); *H03K 2017/0806* (2013.01)

(56) References Cited

U.S. PATENT DOCUMENTS

| | | | |
|---|---|---|---|
| 8,952,642 B2* | 2/2015 | Ayano et al. | 318/472 |
| 2008/0285184 A1 | 11/2008 | Phadke et al. | |
| 2009/0168274 A1 | 7/2009 | Doppel et al. | |
| 2014/0104902 A1* | 4/2014 | Casares | 363/56.01 |
| 2014/0368231 A1* | 12/2014 | Schlueter et al. | 324/762.02 |

* cited by examiner

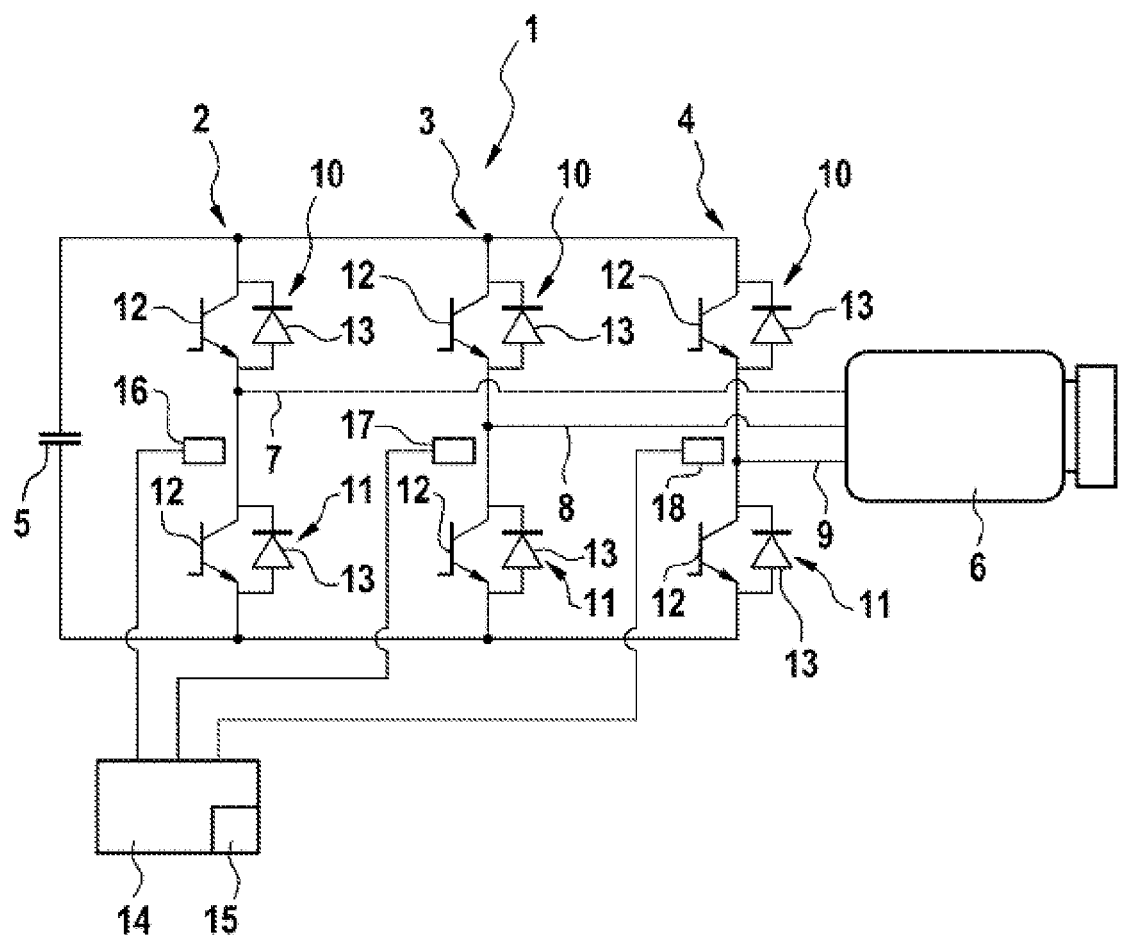

METHOD FOR THE OPERATION OF AN INVERTER, AND INVERTER

BACKGROUND OF THE INVENTION

The invention relates to a method for operating an inverter, particularly a pulse-controlled inverter, wherein the inverter has a plurality of phase systems, each with an outer conductor and at least one semiconductor component, and also a temperature monitoring device that has a plurality of temperature sensors, wherein the temperature sensors are used to sense the temperature of at least one portion of at least one of the phase systems. The invention also relates to an inverter.

Methods of the type cited in the outset are known from the prior art. They are used for operating the inverter. In this case, the inverter has the task of converting a direct current into an alternating current. The reverse direction may also be provided, that is to say conversion from alternating current to direct current. The inverter has a plurality of phase systems, wherein each phase system has an associated outer conductor. The outer conductors have the alternating current applied to them, and in this respect they are situated on an alternating current side of the inverter. Each phase system has the at least one semiconductor component associated with it. By way of example, in order to convert the direct current into alternating current, the semiconductor component can be used to periodically connect the outer conductor such that the alternating current is present on the outer conductor. The semiconductor components of the plurality of phase systems are usually controlled such that the alternating current applied to the outer conductor is present with a phase offset between the phase systems. However, further, non-switchable semiconductor components may also be provided. The inverter and the semiconductor components are actuated using an appropriate control circuit or a controller on which a control program is executed.

The semiconductor components have a characteristic nonreactive internal resistance that, when a current flowing through the respective semiconductor component is present, results in the introduction of heat into said semiconductor component and hence in a rise in temperature. When no current is flowing through the semiconductor component, on the other hand, it emits heat to its environment and matches its temperature to the temperature of the environment over the course of time.

In order to protect the inverter and particularly the semiconductor components from overheating, which involves the inverter or at least a region of the inverter exceeding an admissible maximum temperature, the inverter has the temperature monitoring device. This has a plurality of associated temperature sensors that can be used to sense or are used to sense the temperature of at least one portion or region of at least one of the phase systems. Preferably, each phase system has at least one of the temperature sensors associated with it. Owing to heat conduction effects and/or heat transfer effects, the temperature sensed by means of the respective temperature sensor usually corresponds not to the temperature of the overall phase system but rather to that of only a portion of said phase system. However, if the phase system has an associated element made of a material that is a good conductor of heat and that is in physical contact with regions of the phase system that are to be cooled, and if the temperature sensor is arranged on said element, then it can at least approximately be assumed that the sensed temperature substantially corresponds to the actual temperature of the phase system. By way of example, the element is a heat sink for the phase system or for the inverter and may be part of a cooling device thereof.

If a defect in or damage to at least one of the temperature sensors arises, said temperature sensor cannot be used, or at least can no longer be used, to reliably sense the temperature. For example, the case may arise in which the damaged or defective temperature sensor transmits a constant temperature to the temperature monitoring device. If this constant temperature is not above a maximum temperature that is the maximum admissible for the inverter, the temperature monitoring device permits further operation of the inverter or cannot deactivate the inverter in the event of the corresponding phase system overheating. Hence, the inverter or at least the respective phase system can sometimes be damaged by the overheating.

SUMMARY OF THE INVENTION

By contrast, the method according to embodiments of the invention has the advantage that more reliable monitoring of the temperatures that are present on or in the inverter is possible. In addition, it is possible to establish further defects, particularly in a cooling device of the inverter. The invention achieves this by virtue of a temperature gradient being ascertained from each of the sensed temperatures, the deviation in the ascertained temperature gradients from one another being determined and, if the deviation exceeds at least one threshold value, an error in the cooling device of the inverter being identified. Accordingly, the temperature sensors are used to sense the temperatures of the respective phase systems in a known manner. Next, the sensed temperatures are evaluated, with the temperature gradient, that is to say the change in the temperature over time, initially being ascertained from the sensed temperatures. Next, the aim is to determine the deviation in the temperature gradients ascertained in this manner from one another.

Here, the deviation comprises at least one deviation value, advantageously one deviation value for each ascertained temperature gradient. Each temperature gradient or each of the temperature sensors can therefore be allocated one of the deviation values. If the deviation exceeds the threshold value, the error in the cooling device of the inverter is identified, as a result of which suitable measures can be initiated. The cooling device is used for cooling the inverter or a portion thereof, for example one or more of the phase systems. In this respect, the cooling device, which may be active or passive, is used to transport away heat from the inverter and preferably to emit it to an environment of the inverter. If the cooling device has the error, the quantity of heat transported away is sometimes insufficient, as a result of which the temperature of the inverter rises. If this involves the maximum admissible temperature of the inverter being exceeded, operating faults in the operation of the inverter or even damage can occur.

By way of example, when the error is identified, the inverter is deactivated, as a result of which the phase systems or the semiconductor components no longer carry current. When the error in the cooling device of the inverter is identified, it is also possible to produce an error signal. This is transmitted particularly from the temperature monitoring device to a controller of the inverter. When the error signal occurs, the controller can deactivate the inverter as described or can continue to operate it at restricted power. This reliably prevents further heating of the inverter and therefore damage on account of the maximum temperature being exceeded. The error in the cooling device of the inverter can be identified when just one of the deviation values exceeds the threshold value. Alternatively or in addition, however, it may be necessary for a plurality of the deviation values, particularly all of them, to be greater than the threshold value.

In principle, just one threshold value may be provided. However, there may also be a plurality of different threshold values stipulated. If there are a plurality of threshold values, a respective associated error can be identified when one of the threshold values is exceeded. By way of example, a first error is identified when a first, relatively low threshold value is exceeded and a second error is identified when a second, relatively high threshold value is exceeded (and so on). In this case, it is also possible to produce different error signals. In particular, each of the plurality of threshold values has a respective associated error signal that is produced when the associated threshold value is exceeded. It is therefore possible to define a threshold value for which the error or the error signal indicates a reduction in the cooling power of the cooling device to a particular degree, (for example 50%) and a further, higher threshold value for which, when it is exceeded, the error or the error signal indicates complete failure of the cooling device.

The threshold value may be constant, but can also be determined on a variable basis. In both cases, the threshold value can be indicated either as an absolute value or as a relative value. In the former case, the threshold value is a temperature gradient difference that must not be exceeded by the deviation in the ascertained temperature gradients. In the latter case, the admissible deviation is dependent on the ascertained temperature gradients. However, the threshold value may also be dependent on other factors. By way of example, the threshold value may be present as a function of the ambient temperature and/or the current level of the current flowing through the phase systems and may be greater the higher these are. This makes it possible, for example, to allow for the circumstance that the temperature sensors possibly have a different temperature resolution in different temperature ranges. A corresponding situation applies when a plurality of threshold values are provided.

The inverter is particularly a three-phase inverter, that is to say has three phase systems and likewise many outer conductors. In general, however, any number of phase systems or outer conductors may be present. The threshold value can be exceeded by the deviation by virtue of the occurrence of irregularities in the thermal link between the semiconductor component and a printed circuit board or between the inverter and a baseplate. In both cases, the cooling is impaired; in the former case just the semiconductor component and in the latter case the entire inverter is affected. In both cases, a suitable countermeasure should be initiated in order to prevent damage to the inverter.

In one development of the invention, when the sensed temperature drops below a minimum sensor temperature and/or exceeds a maximum sensor temperature, an error in the temperature monitoring device or in the cooling device of the inverter is identified. Each temperature sensor has a respective associated minimum sensor temperature and/or a respective associated maximum sensor temperature. These temperatures describe the temperature range within which the temperature sensed by means of the temperature sensor is admissible. If the sensed temperature drops below the minimum sensor temperature or if it exceeds the maximum sensor temperature, it can be assumed that the temperature sensor is defective. In this case too, the error in the temperature monitoring device or in the cooling device of the inverter is accordingly identified. The check to determine whether the sensed temperature is outside the temperature range of the temperature sensor is advantageously performed before the temperature gradient is determined. However, provision may also be made for the check to take place only after or during the determination of the temperature gradient.

In one development of the invention, the deviation is determined by virtue of a reference value being subtracted from each temperature gradient, wherein the reference value used is a mean value from the sensed temperature gradients or one of the sensed temperature gradients, particularly the largest or smallest temperature gradient, as reference value. In principle, the reference value can be chosen arbitrarily. By way of example, it may also be present as a constant that corresponds to a mean temperature gradient that can be expected during the operation of the inverter. Advantageously, the reference value is dependent on the ascertained temperature gradients, however. By way of example, it can be stipulated in accordance with the mean value thereof. It is also possible for one of the ascertained temperature gradients to be used as reference value directly. In this case, the ascertained temperature gradient of a particular temperature sensor can be used as reference value. However, it is advantageous if an extreme value for the ascertained temperature gradients is used as a reference value, that is to say particularly the largest or smallest of the ascertained temperature gradients.

In one development of the invention, the sensing of the temperatures, the ascertainment of the temperature gradients and the determination of the deviation in the temperature gradients are carried out repeatedly and only if the deviation exceeds the threshold value repeatedly is the error in the cooling device of the inverter identified. During the operation of the inverter or the temperature monitoring device, it may occur that an error or a temporary fault arises while the temperatures are being sensed. Hence, some of the sensed temperatures cannot be evaluated meaningfully, but rather result in erroneous ascertainment of the temperature gradient and hence in a large deviation that can sometimes exceed to the threshold value. In this case, the error in the cooling device of the inverter is normally identified, even though there is just a brief impairment to the temperature monitoring device or the temperature sensor. In order to prevent such erroneous identification of the error in the cooling device, both the sensing of temperatures and the ascertainment of the temperature gradient, and the determination of the deviation in the temperature gradients from one another or from the estimate, are performed repeatedly.

Whenever the threshold value is exceeded, a counter is incremented, for example. If the counter exceeds a particular limit value, the error in the cooling device is actually identified and the error signal is transmitted, for example. In this case, the counter may be designed such that it is reset or is constantly decremented at a particular rate after a particular period has elapsed. Hence, the occurrence of erroneous sensing of the temperatures within the period is repeatedly admissible. Only if the temperatures are sensed erroneously more frequently within the period and the deviation exceeds the threshold value each time is the error in the cooling device of the inverter identified.

In one development of the invention, each phase system has a plurality of associated semiconductor components and at least some of the semiconductor components have a respective associated temperature sensor. In this case, semiconductor components are intended to be understood to mean particularly transistors and diodes. Usually, each phase system or each outer conductor has two transistors and two diodes, respectively, associated with it, the latter being used as freewheeling diodes. The transistors are actuated by the inverter or the controller thereof such that direct current applied to them is converted into alternating current for the outer conductors, or vice versa. In order to improve the temperature monitoring, provision may now be made for each phase system not just to have an associated temperature sensor, but rather for each phase system to have a plurality of temperature sensors, these being associated with particular semiconductor components. By way of example, provision may be made for each transistor of each phase system to have a respective associated temperature sensor.

In one development of the invention, it is carried out while the phase systems have current applied to them. Only while current is being applied to the phase systems does a change in the actually present temperatures arise, as a result of which the temperature gradient deviates (distinctly) from zero. Accordingly, it makes sense to perform at least the sensing of the temperatures while phase systems or the respective semiconductor component is/are carrying current. Alternatively, the method can naturally be performed shortly after the phase systems have current applied to them. In this case, the temperatures of the phase systems fall until they have essentially aligned themselves with the ambient temperature of the inverter. During this fall in the temperatures, a negative temperature gradient is present. This negative temperature gradient can also be used to perform the evaluation in respect of the deviation in the ascertained temperature gradients from one another or from the estimate. The identification of the error in the cooling device of the inverter is therefore possible in this case too.

In one development of the invention, the inverter is deactivated, or continues to be operated at reduced power, when the error is identified. When the error is present, the cooling of the inverter or at least of a single phase system is impaired, which means that heat can no longer be readily dissipated. For this reason, it makes sense for the phase systems no longer to have current applied to them or at least for the current level to be reduced, that is to say for the inverter to continue to be operated at reduced power. In this way, damage to the inverter or the phase systems can be avoided.

The invention also relates to an inverter, particularly for carrying out the method described above, wherein the inverter has a plurality of phase systems, each with an outer conductor and at least one semiconductor component, and also a temperature monitoring device that has a plurality of temperature sensors, wherein the temperature sensors can be used to sense the temperature of at least one portion of at least one of the phase systems. In this case, provision is made for the temperature monitoring device to be designed to ascertain a temperature gradient from each of the sensed temperatures, to determine the deviation in the ascertained temperature gradients from one another and, if the deviation exceeds at least one threshold value, to identify an error in a cooling device of the inverter. In principle, the inverter may be developed in line with the explanations above. An inverter embodied in such a way can be used to implement the advantages cited at the outset, particularly to implement more reliable temperature monitoring.

BRIEF DESCRIPTION OF THE DRAWINGS

The invention is explained in more detail below with reference to the exemplary embodiments illustrated in the drawing without the invention being limited. In this case, the single FIGURE shows a schematic illustration of an inverter.

DETAILED DESCRIPTION

The FIGURE shows a schematic illustration of an inverter 1, which in this case is present as a three-phase inverter. Accordingly, the inverter 1 has three phase systems 2, 3, 4. The inverter is used for inverting direct current from a direct current source 5 for the purpose of operating an electric machine 6, particularly an AC motor. The inverter 1 can also be used to convert alternating current provided by means of the electric machine 6 into direct current for buffer-storage in the direct current source 5. The electric machine 6 is connected to outer conductor 7, 8, 9 of the inverter 1. In this case, each outer conductor 7, 8, 9 is associated with one of the phase systems 2, 3, 4. In the exemplary embodiment shown here, the outer conductor 7 is associated with the phase system 2, the outer conductor 8 is associated with the phase system 3 and the outer conductor 9 is associated with the phase system 4.

Each of the phase systems 2, 3, 4 has two switching elements 10 and 11, one of the switching elements 10 and 11 being in the form of a high-side switch and the other being in the form of a low-side switch. Each switching element 10 and 11 has a transistor 12 and a diode 13, which are present as semiconductor components. The diode 13 forms a freewheeling diode for each of the switching elements 10 and 11. The transistors 12 of the switching elements 10 and 11 or of the phase systems 2, 3, 4 can be periodically actuated by a controller 14 of the inverter 1. In this case, the actuation is effected such that alternating current for operating the electric machine 6 is provided from the direct current delivered by the direct current source 5. The converse procedure is also possible in line with the explanations above.

In addition, the inverter 1 has a temperature monitoring device 15, which is present as part of the controller 14, that is to say is integrated therein, in the exemplary embodiment shown here. The temperature monitoring device 15 has temperature sensors 16, 17 and 18 connected to it, each of the temperature sensors 16, 17 and 18 being associated with one of the phase systems 2, 3 and 4. The temperature sensors 16, 17 and 18 can therefore be used to sense the temperature of at least one portion of the respective phase system 2, 3 or 4. The temperature monitoring device 15 is thus provided for the purpose of ascertaining a temperature gradient from each of the sensed temperatures, determining the deviation in the ascertained temperature gradients from one another and, if the deviation exceeds a threshold value, identifying an error in a cooling device (not shown here) of the inverter. By way of example, each temperature gradient is allocated a deviation value for the deviation in this case.

If the deviation or at least one of the deviation values exceeds the threshold value, it can be inferred that the respective temperature sensor 16, 17 and 18 is defective or at least cannot reliably ascertain the temperature that is actually present. A defect in the cooling of the inverter or one of the phase systems 2, 3 or 4 is also conceivable. If the error in the cooling device is identified, the temperature monitoring device 15, for example, transmits an error signal to the controller 14. The controller 14 can then initiate suitable measures, for example can display an error message and/or deactivate the inverter 1, that is to say can switch the switching elements 10 and 11 or the transistors 12 thereof so as no longer to perform inversion or rectification. This can prevent damage to the inverter 1 through the occurrence of an excessive temperature.

The invention claimed is:

1. A method for operating an inverter, wherein the inverter has a plurality of phase systems, each with an outer conductor and at least one semiconductor component, and also a temperature monitoring device that has a plurality of temperature sensors, wherein the temperature sensors are used to sense the temperature of at least one portion of at least one of the phase systems, the method comprising:
ascertaining a temperature gradient from each of the sensed temperatures, determining the deviation in the ascertained temperature gradients from one another and, if the deviation exceeds at least one threshold value, identifying an error in a cooling device of the inverter.

2. The method as claimed in claim 1, wherein if the sensed temperature drops below a minimum sensor temperature and/or exceeds a maximum sensor temperature, an error in the temperature monitoring device or in the cooling device of the inverter is identified.

3. The method as claimed in claim 1, wherein the deviation is determined by virtue of a reference value being subtracted from each temperature gradient, wherein the reference value used is a mean value from the sensed temperature gradients or one of the sensed temperature gradients.

4. The method as claimed in claim 1, wherein the sensing of the temperatures, the ascertainment of the temperature gradients and the determination of the deviation in the temperature gradients are carried out repeatedly and only if the deviation exceeds the threshold value repeatedly is the error in the cooling device of the inverter identified.

5. The method as claimed in claim 1, wherein each phase system has a plurality of associated semiconductor components and at least some of the semiconductor components have a respective associated temperature sensor.

6. The method as claimed in claim 1, wherein the phase systems have current applied to them.

7. The method as claimed in claim 1, wherein the inverter is deactivated, or continues to be operated at reduced power, when the error is identified.

8. An inverter comprising: a plurality of phase systems, each with an outer conductor and at least one semiconductor component, and also a temperature monitoring device that has a plurality of temperature sensors, wherein the temperature sensors can be used to sense the temperature of at least one portion of at least one of the phase systems, wherein the temperature monitoring device is designed to ascertain a temperature gradient from each of the sensed temperatures, to determine the deviation in the ascertained temperature gradients from one another and, if the deviation exceeds at least one threshold value, to identify an error in a cooling device of the inverter.

* * * * *